United States Patent
Liu

(10) Patent No.: US 11,137,504 B2
(45) Date of Patent: Oct. 5, 2021

(54) TILED RADIATION DETECTOR

(71) Applicant: General Electric Company, Schenectady, NY (US)

(72) Inventor: James Zhengshe Liu, Salt Lake City, UT (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 858 days.

(21) Appl. No.: 15/365,689

(22) Filed: Nov. 30, 2016

(65) Prior Publication Data

US 2017/0227657 A1 Aug. 10, 2017

Related U.S. Application Data

(60) Provisional application No. 62/292,043, filed on Feb. 5, 2016.

(51) Int. Cl.
*G01T 1/36* (2006.01)
*G01T 1/20* (2006.01)
*G01T 1/202* (2006.01)
*H01L 27/146* (2006.01)

(52) U.S. Cl.
CPC .......... *G01T 1/2018* (2013.01); *G01T 1/2023* (2013.01); *H01L 27/14676* (2013.01)

(58) Field of Classification Search
CPC ..... G01T 1/1642; G01T 1/208; G01T 1/1647; G01T 1/17; G01T 1/2985
See application file for complete search history.

(56) References Cited

U.S. PATENT DOCUMENTS

| | | | |
|---|---|---|---|
| 7,016,461 B2 | 3/2006 | Rotondo et al. | |
| 8,076,647 B2 | 12/2011 | Danielsson et al. | |
| 8,193,501 B2 | 6/2012 | Rutten et al. | |
| 8,903,043 B2 | 12/2014 | Durst et al. | |
| 8,942,346 B2 | 1/2015 | Nicholson et al. | |
| 2002/0090184 A1 | 7/2002 | Sayag | |
| 2003/0058989 A1 | 3/2003 | Rotondo et al. | |
| 2004/0120457 A1 | 6/2004 | Karellas et al. | |
| 2006/0126780 A1 | 6/2006 | Rotondo et al. | |
| 2009/0321643 A1 | 12/2009 | Rutten et al. | |
| 2010/0096558 A1 | 4/2010 | Danielsson et al. | |
| 2011/0297839 A1* | 12/2011 | Berauer | G01T 1/2018 250/370.11 |

(Continued)

FOREIGN PATENT DOCUMENTS

| | | |
|---|---|---|
| JP | 2005198837 A | 7/2005 |
| WO | 2010092516 A1 | 8/2010 |

OTHER PUBLICATIONS

Office Action dated Mar. 28, 2019, related DE Patent Application No. 10 2016 125 331.6.

*Primary Examiner* — David P Porta
*Assistant Examiner* — Mamadou Faye
(74) *Attorney, Agent, or Firm* — Fletcher Yoder, P.C.

(57) ABSTRACT

The present approaches relate to the fabrication of non-rectangular (e.g., non-square) light imager panels having comparable active areas to rectangular light imager panels but manufactured using fewer c-Si wafers. Such light imager panels may be generally squircle shaped (e.g., a square or rectangle with one or more rounded corners and may be manufactured using conventional crystalline silicon (c-Si) wafers, such as 8" wafers.

18 Claims, 7 Drawing Sheets

(56) References Cited

U.S. PATENT DOCUMENTS

| | | | |
|---|---|---|---|
| 2012/0133054 A1* | 5/2012 | Tkaczyk | G01T 1/243 |
| | | | 257/777 |
| 2012/0181437 A1 | 7/2012 | Nelson et al. | |
| 2013/0026380 A1* | 1/2013 | Tkaczyk | G01T 1/2928 |
| | | | 250/370.13 |
| 2013/0037857 A1 | 2/2013 | Von Kanel et al. | |
| 2013/0103339 A1 | 4/2013 | Durst et al. | |
| 2013/0168796 A1* | 7/2013 | Ikhlef | H01L 27/14636 |
| | | | 257/448 |
| 2013/0256543 A1* | 10/2013 | Granfors | G01T 1/2018 |
| | | | 250/370.09 |
| 2014/0177795 A1 | 6/2014 | Spahn | |
| 2015/0046112 A1 | 2/2015 | Durst et al. | |
| 2015/0303228 A1 | 10/2015 | Rohr | |
| 2016/0070004 A1 | 3/2016 | Liu | |

* cited by examiner

TILED RADIATION DETECTOR

CROSS-REFERENCE TO RELATED APPLICATION

This application claims priority to and the benefit of U.S. Application No. 62/292,043, entitled "TILED RADIATION DETECTOR", filed Feb. 5, 2016, which is herein incorporated by reference in its entirety.

BACKGROUND

This application relates generally to systems and methods for obtaining and displaying an X-ray image. In particular, this application relates to systems and methods for fabricating a digital flat panel detector having a non-rectangular shape.

Digital X-ray imaging systems are used to generate digital data in a non-invasive manner and to reconstruct such digital data into useful radiographic images. In current digital X-ray imaging systems, radiation from a source is directed toward a subject or object, typically a patient in a medical diagnostic application, a package or baggage in a security screening application, or a fabricated component in an industrial quality control or inspection application. A portion of the radiation passes through the subject or object and impacts a detector. The scintillator of the detector converts the higher-energy X-ray radiation to lower-energy light photons that are sensed using photo-sensitive components (e.g., photodiodes or other suitable photodetectors) present on a light imager panel. The light imager panel is typically divided into a matrix of discrete picture elements or pixels, and encodes output signals based upon the quantity or intensity of the radiation impacting the scintillator above each pixel region. The signals may then be processed to generate an image that may be displayed for review.

Portions of the detector, such as the light imager panel, may be based on or formed from a silicon semiconductor substrate. Such a silicon substrate may be provided as crystalline silicon (c-Si), which consists of an ordered silicon matrix (e.g., a well ordered crystal lattice), or amorphous silicon (a-Si), which does not have an ordered matrix (e.g., a random crystal lattice). The random crystal lattice of a-Si typically provides a much lower electron mobility than that provided by an ordered crystal lattice of c-Si (e.g., <1 $cm^2/(v \cdot s)$ compared to approximately 1,400 $cm^2/(v \cdot s)$). Despite this, the mainstream technology for fabricating X-ray panels for medical and industrial inspection utilizes amorphous silicon TFTs due to their competitive cost and large area capability. In particular, X-ray panels for medical and industrial inspection often require large area image sensors, typically ranging from 20 cm×20 cm to 40 cm×40 cm and more, and such large sensors can typically be made using a-Si technology more readily than using c-Si technology.

However, in some applications there is a growing need to build panels with higher resolution and lower electronic noise than may be achievable with a-Si technology. Because of the higher electron mobility associated with c-Si the size of features that can be formed using c-Si can be much smaller than those formed from the a-Si. Thus, X-ray detectors based on c-Si technology, such as those employing complementary metal-oxide-semiconductors (CMOS) formed from c-Si, may outperform traditional a-Si based X-ray detector in various ways. However, light imager panels based on c-Si technology, such as those employing CMOS formed from c-Si, may be costly to fabricate for a variety of factors. For example, depending on the size and shape of the light imager panel to be fabricated, multiple c-Si wafers may be needed to fabricate pieces of the panel, which may be tiled to form the overall panel. Likewise, the fabrication time (e.g., the number of masks applied and/or processing steps performed) is proportional to fabrication costs. Similarly, the yield of the fabricated wafers and/or of the cutting and tiling processes may limit the cost improvements that are possible. The present approaches address one or more of these factors.

BRIEF DESCRIPTION

In one embodiment, a flat panel X-ray detector is provided. In accordance with this embodiment, the flat panel X-ray detector includes a scintillator layer that converts X-ray photons into lower energy light photons and a light imager layer configured to convert the light photons into electrons. The light imager layer comprising a tiled arrangement of imager panels. At least one imager panel comprises a non-rectangular active area. The flat panel X-ray detector further includes a readout device that converts the electrons into digitized pixel values and a communication unit that transfers the pixel values to an imaging system that is connected to the detector.

In a further embodiment, a method for forming a light imager panel is provided. In accordance with this method, a silicon wafer is diced into wedge-shaped quadrant imager tiles. The wedge-shaped quadrant tiles are separated along at least one dimension. At least a pair of rectangular imager tiles are positioned between the separated wedge-shaped quadrant tiles to form a non-rectangular light imager panel.

In an additional embodiment, a light imager panel for use in a radiation detector is provided. In accordance with this embodiment, the light imager panel includes four wedge-shaped panels forming the rounded corners of the light imager panel and two or more rectangular panels positioned between the wedge-shaped panels to form straight edges of the light imager panel.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

Figure 1:
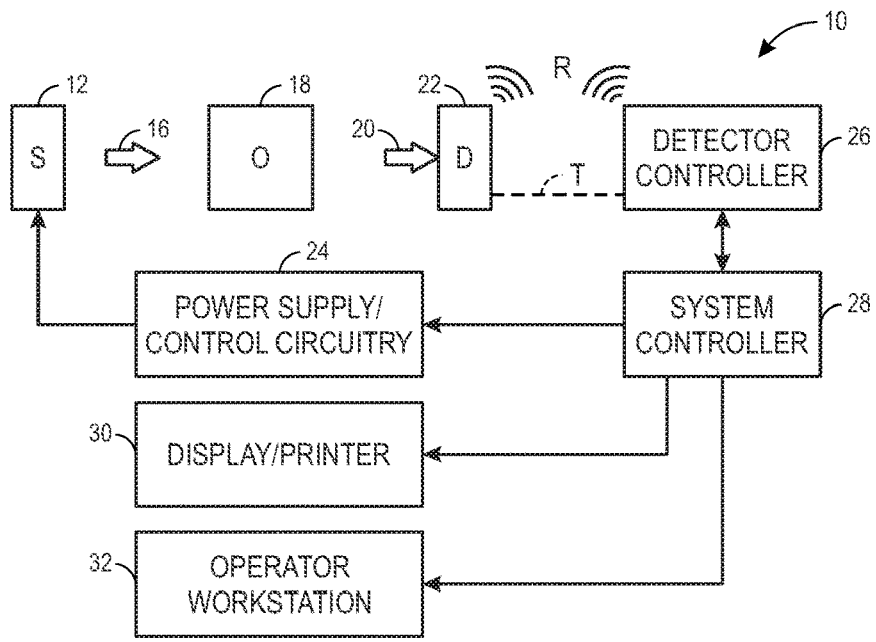
FIG. 1 depicts a block-diagram of an embodiment of a digital X-ray imaging system, in accordance with aspects of the present disclosure.

In the drawings, the thickness and size of components may be exaggerated or otherwise modified for clarity. Further, for clarity, the drawings may show simplified or partial views, and the dimensions of elements in the drawings may be exaggerated or otherwise not in proportion.

DETAILED DESCRIPTION

One or more specific implementations will be described below. In an effort to provide a concise description of these implementations, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements.

While the following discussion is generally provided in the context of medical imaging, it should be appreciated that the present techniques are not limited to such medical contexts. Indeed, any examples and explanations provided in such a medical context is only to facilitate explanation by providing instances of real-world implementations and applications. However, the present approaches may also be utilized in other contexts, such as the non-destructive inspection of manufactured parts or goods (i.e., quality control or quality review applications), and/or the non-invasive inspection of packages, boxes, luggage, and so forth (i.e., security or screening applications).

Light imager panels based on c-Si technology (such as those employing CMOS formed from c-Si) may outperform comparable a-Si imager panels in various ways when used in an X-ray detector. However, c-Si light imager panels are typically associated with higher cost and smaller panel size due to limitations in the practical size of silicon wafers used to fabricate c-Si devices and in waste attributable to the differing shapes and sizes of the c-Si wafers commercially available and the conventional X-ray detector sizes and shapes. Such cost and wafer efficiency issues may limit the practicality of using c-Si light imager panels in conventional X-ray detectors.

As discussed herein, approaches are discussed for improving the efficiency with which c-Si wafers are used to fabricate light imager panels of X-ray detectors. In particular, fabrication of non-rectangular (e.g., non-square) detectors and light imager panels that still provide the specified "active area" for a given imaging application are described. As used herein, the term "active area" refers to that region of the detector or detector panel used by the system to generate images (i.e., to that portion of the detector from which acquired signals are processed to generate an image). In addition, approaches for fabricating such non-rectangular detectors so as to maximize use of the respective c-Si wafers are described.

With the preceding in mind, and turning now to the drawings, FIG. 1 illustrates diagrammatically an imaging system 10 for acquiring and processing image data using a detector fabricated and/or operated as discussed herein. In the illustrated embodiment, system 10 is a digital X-ray system designed both to acquire original image data and to process the image data for display. The imaging system 10 may be a stationary or mobile X-ray system. In the embodiment illustrated in FIG. 1, imaging system 10 includes a source of X-ray radiation 12 that emits a stream of radiation 16 into a region in which an object or subject 18 is positioned. The X-ray radiation source 12 is controlled by a power supply/control circuit 24 which furnishes both power and control signals for examination sequences. A portion of the radiation 20 passes through or around the subject and impacts a digital X-ray detector, represented generally at reference numeral 22. The detector 22 may be portable or permanently mounted to the system 10. In certain embodiments, the detector 22 may convert the incident X-ray photons to lower energy photons which are detected. Electrical signals are generated in response to the detected photons and these signals are processed to reconstruct an image of the features within the object or subject.

As discussed herein, the detector array 22 may include one or more CMOS light imager panels, each separately defining an array of detector elements (e.g., pixels). Each detector element produces an electrical signal that represents the intensity of the X-ray beam incident at the position of the detector element when the beam strikes the detector 22. In the depicted example, the detector 22 includes or communicates with a detector controller 26 (e.g., control circuitry) which commands acquisition of the signals generated in the detector 22. In the presently illustrated embodiment, the detector 22 may communicate with the detector controller 26 via any suitable wireless communication standard (R), although the use of digital X-ray detectors 22 that communicate with the detector controller 26 through a cable (T) or some other mechanical connection are also envisaged. Alternatively, operational aspects of the detector controller 26 may be implemented on, or otherwise provided of, the detector 22 itself in some implementations. Detector controller 26 may also execute various signal processing and filtration functions, such as for initial adjustment of dynamic ranges, interleaving of digital image data, and so forth.

Both power supply/control circuit 24 and detector controller 26 are responsive to signals from a system controller 28. In general, system controller 28 commands operation of the imaging system to execute examination protocols and to process acquired image data. In the present context, system controller 28 may also include signal processing circuitry and one or more data storage structures, such as optical memory devices, magnetic memory devices, or solid-state memory devices, for storing programs and routines executed by a processor of the system 10 to carry out various functionalities, as well as for storing configuration parameters and image data. In one embodiment, a programmed computer system may be provided with hardware, circuitry, firmware, and/or software for performing the functions attributed to one or more of the power supply/control circuit 24, the detector controller 26, and/or the system controller 28.

In the embodiment illustrated in FIG. 1, system controller 28 is linked to at least one output device, such as a display or printer as indicated at reference numeral 30. The output device may include standard or special purpose monitors and associated processing circuitry. One or more operator workstations 32 may be further linked in the system for outputting system parameters, requesting examinations, viewing images, and so forth. In general, displays, printers, workstations, and similar devices supplied within the system may be local to the data acquisition components, or may be remote from these components, such as elsewhere within an institution or hospital, or in an entirely different location, linked to the image acquisition system via one or more configurable networks, such as the Internet, virtual private networks, cloud-based network, and so forth.

The X-ray system 10 as shown in FIG. 1 may also include a variety of alternative embodiments generally configured to meet the particular needs of certain applications. For example, the X-ray system 10 may be either fixed, a mobile system, or a mobile C-arm system where the X-ray detector is either permanently mounted inside one end of the C-arm or removable from the system. Further, the X-ray system 10 may be a table and/or wall stand system in a fixed X-ray room where the X-ray detector 22 is either permanently mounted together with the system or portable. Alternatively, the X-ray system 10 may be a mobile X-ray system with a portable X-ray detector. Such a portable X-ray may be further constructed with a detachable tether or cable used to connect the detector readout electronics to the data acquisition system of the scanner. When not in use, a portable X-ray detector may be detached from the scan station for storage or transfer. In practice, the imaging system 10 may be any suitable X-ray based imaging system, including, but not limited to, conventional radiography systems, CT imaging systems, tomosynthesis systems, C-arm systems, fluoroscopy systems, mammography systems, dual- or multiple-energy systems, navigational or interventional imaging systems, and so forth.

Figure 2:
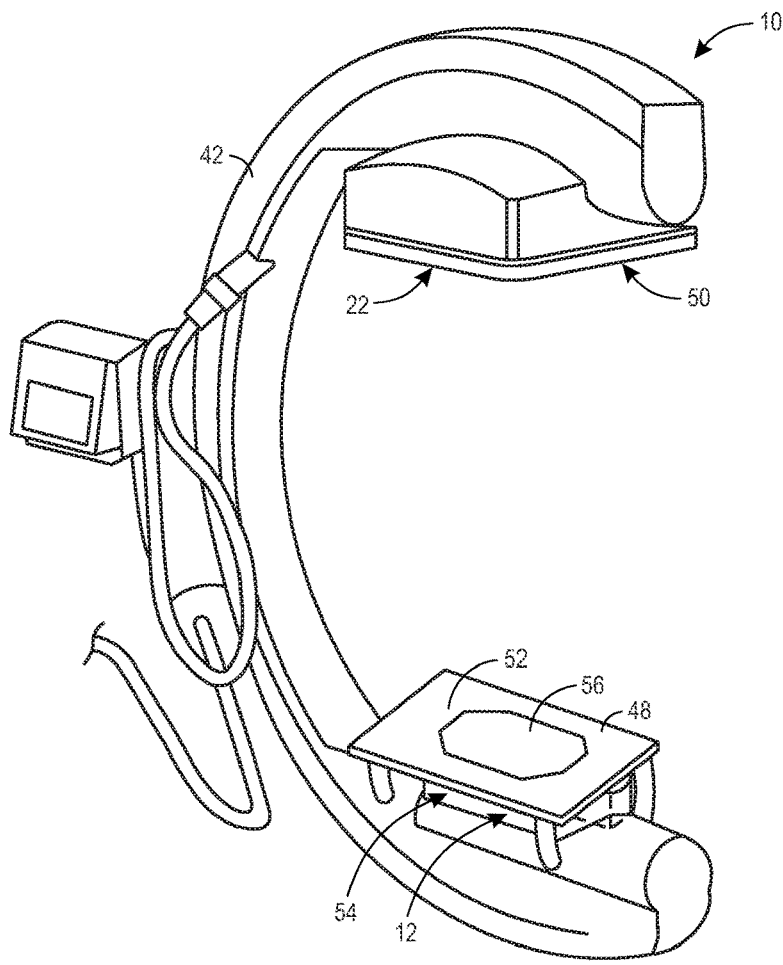
FIG. 2 depicts an implementation of an X-ray imaging system, in accordance with aspects of the present disclosure.

While the preceding schematically describes components of an X-ray based imaging system 10, including a detector and detector control and readout circuitry as discussed herein, FIG. 2 depicts an example of how such an imaging system 10 may be provided in a real-world context. As noted above, the X-ray system 10 may be implemented as a mobile X-ray device (e.g., an X-ray device comprising a C-arm, a mini C-arm, an O-arm, a non-circular arm, and so forth), and a fixed X-ray device. By way of illustration, FIG. 2 shows an X-ray imaging system 10 that comprises a C-arm X-ray device 42 configured to rotate a detector panel 22 and X-ray source 12 about a volume to be imaged. In the depicted example, the X-ray system 10 also includes a collimator 48. Any suitable X-ray source 12 can be used, including a standard X-ray source, a rotating anode X-ray source, a stationary or fixed anode X-ray source, a solid state X-ray emission source, or a fluoroscopic X-ray source 54 (as shown in FIG. 2). Any suitable X-ray detector 22 can be used, including a digital detector as discussed in greater detail below.

FIG. 2 shows an implementation in which the collimator 48 comprises an X-ray attenuating material 52 that defines an aperture 56 through which X-ray may pass, and which in turn prevents or limits X-ray emission beyond the bound of the defined aperture, thus shaping and limiting the defined beam. The collimator 48 can comprise any suitable X-ray attenuating material 52 that allows it to collimate an X-ray beam in this manner. Some examples of suitable X-ray attenuating materials include tungsten, lead, gold, copper, tungsten-impregnated substrates (e.g., glass or a polymer impregnated with tungsten), coated substrates (e.g., glass or a polymer coated with tungsten, lead, gold, etc.), steel, aluminum, bronze, brass, rare earth metals, or combinations thereof.

Figure 3:
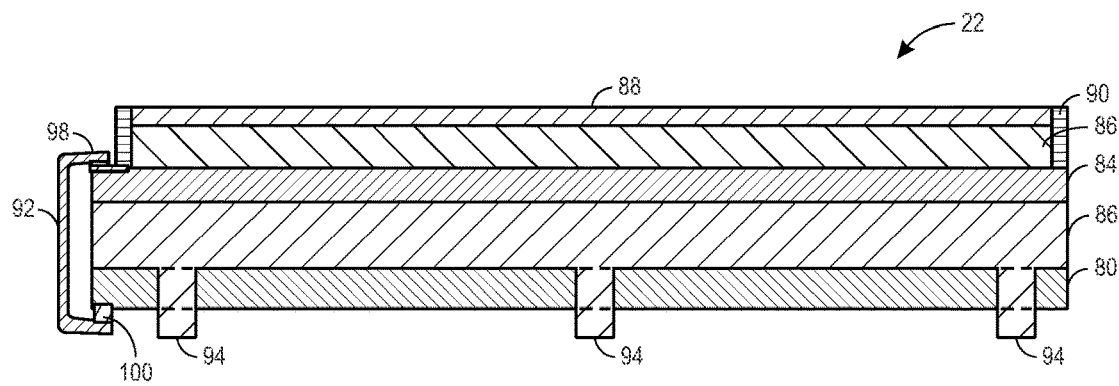
FIG. 3 shows a schematic side view illustrating components of a flat panel detector, in accordance with aspects of the present disclosure.

With respect to the detector component 22 of an imaging system 10, FIG. 3 depicts a cross-section side-view illustrating components that may be present in such a detector 22. In the example depicted in FIG. 3, the flat panel detector (or detector assembly) 22 contains a circuit board 80, a supporting substrate 82, a light imager panel 84, scintillator 86, scintillator cover 88, sealant 90, and connector 92. In the depicted example, the substrate 82 may primarily provide support to the remainder of components in the detector 10. Accordingly, the substrate 82 can be made of any material and/or structure that provides this support. In some configurations, the substrate 82 can be made from metal, metal alloy, plastic, a composite material, carbon fiber, or a combination of these materials.

In FIG. 3, the detector controlling electronics are structured underneath the supporting substrate 82 and connected to the light imager 84 through the connector 92 in order to maintain a minimal x-y dimension. The supporting substrate 82 is connected to the detector cover with the connection poles 94 through suspensive components. The components of the detector 10 illustrated in FIG. 3 may represent only some of the components present in such detection systems. For example, detectors 10 may include other electronics, batteries, wireless transceivers, communication and power supply cables, an outer cover or sleeve, suspensive components, and so forth.

In the depicted detector implementation of FIG. 3, the detector 22 (e.g., a CMOS based detector) includes a scintillator layer (e.g., scintillator 86) that is disposed on a light imager panel 84 (e.g., CMOS light imager). The scintillator 86 may be fabricated from any scintillator compositions such as cesium iodide (CsI) or lutetium oxide ($Lu_2O_3$). To protect the scintillator 86 from moisture and to provide structural support, a scintillator cover (or cover) 88 may be placed over the surface of the scintillator 86, as shown in FIG. 3. The cover 88 may be fabricated with metal, metal alloy, plastic, a composite material, or a combination of the above material. In some embodiments, the cover 88 may be composed of low X-ray attenuation, lightweight, durable composite material such as a carbon fiber. In some embodiments, the detector 10 may include a moisture blocking layer or sealant to block moisture from entering into the scintillator material 86. Thus, as illustrated in FIG. 3, the detector 10 includes a sealant 90 that can be disposed around the side surface of the cover 88 as well as the outer edges of the scintillator 86.

In some configurations, the light imager 84 includes a pixelated photodetection layer, as discussed in greater detail below. Some conventional detached scintillator plates (e.g., in CMOS based detectors) are coated by a protective film that exhibits poor light reflection and transparency properties which results in sub-optimal performance of the photodetection capabilities of the X-ray detector. To alleviate this deficiency, the scintillator 86 in detector 10 can be directly disposed upon the photodetection layer of the light imager 84. Thus, in these configurations, the scintillator 86 can directly contact the photodetection layer.

As discussed herein, the scintillator 86 and the photodetection layer of the light imager 84 function in combination to convert X-ray photons to electrical signals for acquiring and processing image data. Generally, X-ray photons are emitted from a radiation source (such as an x-ray source 12), traverse the area in which an object 18 or subject is positioned, and then collide with the scintillator 86. The scintillator 86 converts the X-ray photons to lower energy optical photons and is designed to emit light proportional to the energy and the amount of X-rays absorbed. As such, light emissions will be higher in those spatial regions of the scintillator 86 where more X-rays were received. Since the composition of the object or subject will attenuate the X-rays projected by the radiation source to varying degrees, the energy level and the amount of the X-ray photons colliding with the scintillator 86 will not be uniform across the scintillator 86. The non-uniform collision results in the variation of light emission that will be used to generate contrast in the reconstructed image.

After the X-ray photons are converted to optical photons, the resulting optical photons emitted by the scintillator 86 are detected by the photodetection layer of the light imager 84. The photodetection layer may contain an array of photosensitive elements or detector elements (e.g., pixels) that store an electrical charge in proportion to the quantity of incident light absorbed by the respective detector elements. Generally, each detector element has at least a light sensitive region and an electronically-controlled region (e.g., a thin-film-transistor (TFT)) for the storage and output of electrical charge from that detector element. The light sensitive region may be composed of a photodiode, which absorbs light and subsequently creates electronic charges stored in the photodiode or a storage capacitor. After exposure, the electrical charge in each detector element is read out via logic-controlled electronics and processed by the imaging system.

The detector 10 also contains an electrical connection between the light imager 84 and the circuit board 80. In the embodiments illustrated in FIG. 3, this electrical connection comprises flex connector 92. The flex connector 92 is used to connect the circuit board 80 and the light imager 84 (both of which are substantially rigid) with room for the movement of one or both. The light imager 84 in FIG. 3 may shift due to mechanical force such as vibration, yet the flex connector 92 maintains the electrical connection despite this movement. The flex connector 92 can be connected to the light imager 84 and the circuit board 80 using any connection, including a thermosonic bond 98 to the light imager 84 and Hirose-type connector 100 to the circuit board 80.

With the preceding in mind, in practice a light-imager panel 84 may be too large to be fabricated from a single silicon wafer (e.g., a c-Si wafer) in the desired geometric shape, such as a rectangular or square shape. Instead, to achieve the desired size and shape for the light imager panel 84, sub-panels may be formed and tiled together to form the light imager panel. By way of example, the sub-panels may be formed as all being the same size or, alternatively, with some being different sizes and combined (i.e., tiled) so as to form the finished light imager panel 84 having a desired shape and area. In one example, the overall light imager panel 84 has 1,536 rows and 1,536 columns of detector elements 122 (i.e., pixels), some of which may be dummy rows or columns or are info lines to account for interconnection interfaces and tiling spatial requirements. In one such example, the detector elements are square and measure 0.135 mm on a side. In this example, the light imager panel may be formed using two different sizes of sub-panels, a larger panel having an array of 1,023×767 detector elements (and thus measuring 138.11 mm×103.55 mm) and smaller panels having an array of 512×768 detector elements (and thus measure 69.12 mm×103.68 mm). As a result, taking into account tiling rows and columns, the overall light imager panel 84 in such an implementation is approximately 207.23 mm×207.23 mm (i.e., approximately 8"×8").

Figure 4:
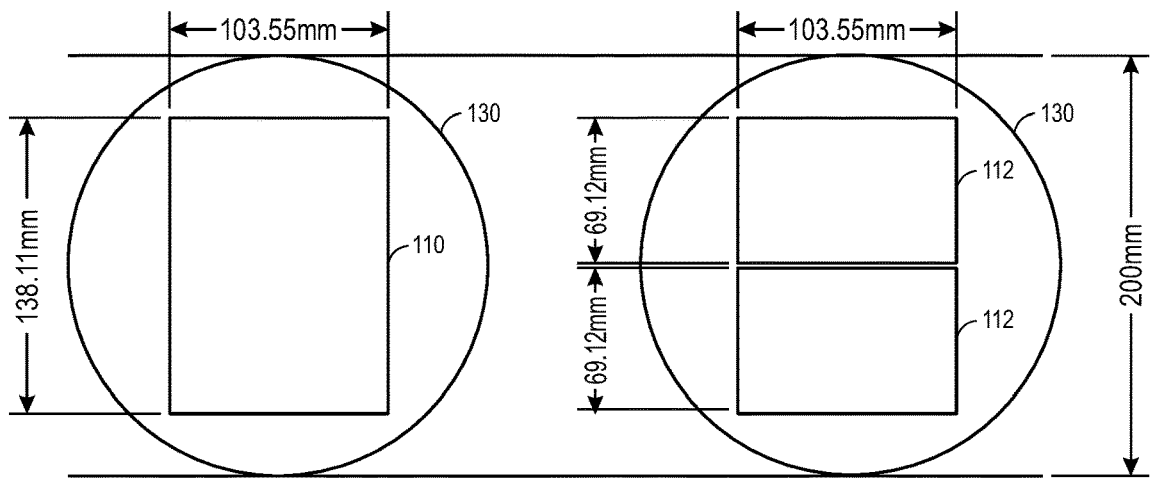
FIG. 4 depicts geometric aspects of forming tiled elements of a rectangular light imager panel using conventional circular c-Si wafers.

Turning to FIG. 4, geometric and fabrication considerations of such sub-panels are shown. In this example, to form the sub-panels 110, 112, from conventional 8" c-Si wafers, a certain amount of waste is incurred. In particular, a single wafer 130 may only accommodate fabrication of one large sub-panel 110 or two smaller sub-panels 112, as shown in FIG. 4. As a consequence, in this example three 8" c-Si wafers 130 are needed to fabricate a single rectangular or square light imager panel 84 as described above with substantial corresponding waste of c-Si material. As will be appreciated, though a specific example of an approximate 8"×8" light imager panel 84 and corresponding tiled sub-panels are provided by way of example and to facilitate explanation of the issues, the present issues related to light imager panel fabrication and c-Si wafer wastage, may be generalized to a wide variety of panel sizes.

With the preceding in mind, the present approach attempts to address certain of these issues by employing non-rectangular (e.g., non-square) detector shapes that still provide a comparable active area for image generation (i.e., the portion of the detector from which acquired signals are processed to generate an image). By way of example, and turning to FIG. 5, such a detector shape may include circular detectors or "squircle" detectors having a superellipse shape or a cornerless shape. In these examples, a cornerless shape comprises a shape missing one or more ninety-degree corners (i.e., two edges that run substantially perpendicular to each other without containing a ninety-degree corner between those edges). The cornerless shape may contain corners with a degree less than ninety-degrees. Some examples of such shapes include a rounded square, a rounded rectangle, a chamfered square, a chamfered rectangular, a rectangle with curved borders, a truncated circle, an octagon, a hexagon, or any other suitable shape.

Where the detector has the shape of a superellipse, it can have any suitable characteristic that allows it to be classified as a superellipse. By way of example, the aperture can be a shape that is generated by a formula selected from: (i) $|x-a|^n+|y-b|^n=|r|^n$, or $$\left|\frac{(x-a)}{r_a}\right|^n + \left|\frac{(y-b)}{r_b}\right|^n = 1 \qquad \text{(ii)}$$

wherein a, b is the center point; r is the minor; n is equal to 4; and $r_a$ and $r_b$ are the semi-major and semi-minor axes, respectively.

Figure 5:
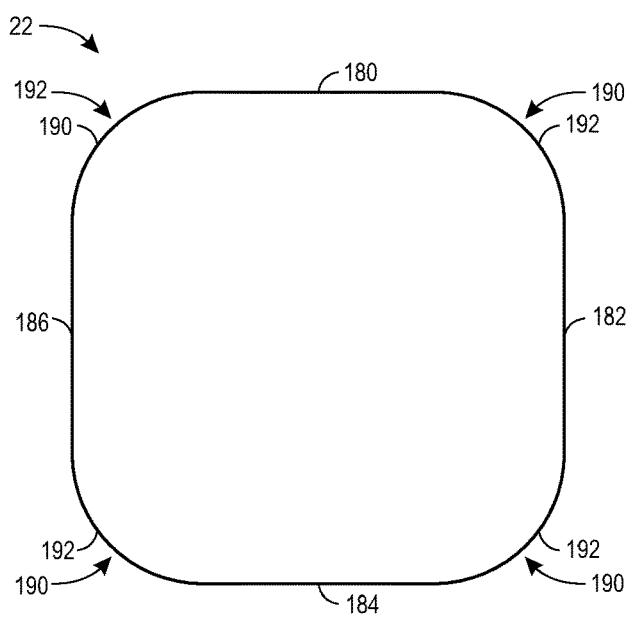
FIG. 5 depicts an example of a squircle-shaped flat panel detector, in accordance with aspects of the present disclosure.

FIG. 5 depicts an example of a detector 22 shaped as a superellipse. In FIG. 5, the detector 22 contains a first 180 and second 182 images edge, a second 182 and third 184 edge, a third 184 and fourth 186 edge, and a fourth 186 and first 180 edge, respectively, which do not physically intersect at a ninety-degree corner. Rather, the detector corners 190 are removed so the detector's first edge 180 and third edge 154 are each separated from the second edge 182 and fourth edge 54 by a non-linear (i.e., substantially curved) image border, e.g., arc-shaped borders 192.

As will be appreciated, the detector shape illustrated in FIG. 5 is generalized so as to simplify explanation. Because the corners regions of a square or rectangular detector may not provide useful or usable image data, depending on the scanner configuration, such a rounded corner configuration may provide an active area similar or identical to that available from a rectangular or square detector having a larger surface area. Further, such a rounded-corner design may be fabricated with less waste of materials, as discussed in greater detail below.

Figure 6:
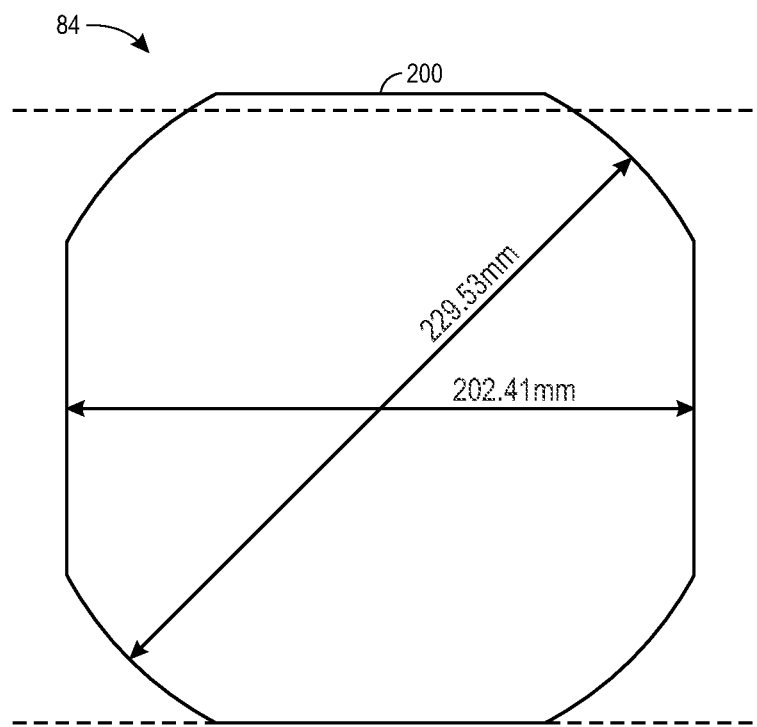
FIG. 6 depicts a non-rectangular active area shape for a light imager panel, in accordance with aspects of the present disclosure.

Turning to FIG. 6, one example of a non-rectangular light imager panel having an active area comparable to that of a square panel as described above is provided. In this example, a rounded-corner light imager panel 84 is shown having a square side length of 202.41 mm (corresponding to 1,499 rows or columns of square detector elements having a length of 0.135 mm per side). The depicted example also has a round corner diameter of 229.53 mm (i.e., 202.41 mm×1.134). Geometrically, this non-rectangular shape 200 is broken down in FIG. 7 for a better appreciation of the basis for both the shape 200 and measurements.

Figure 7:
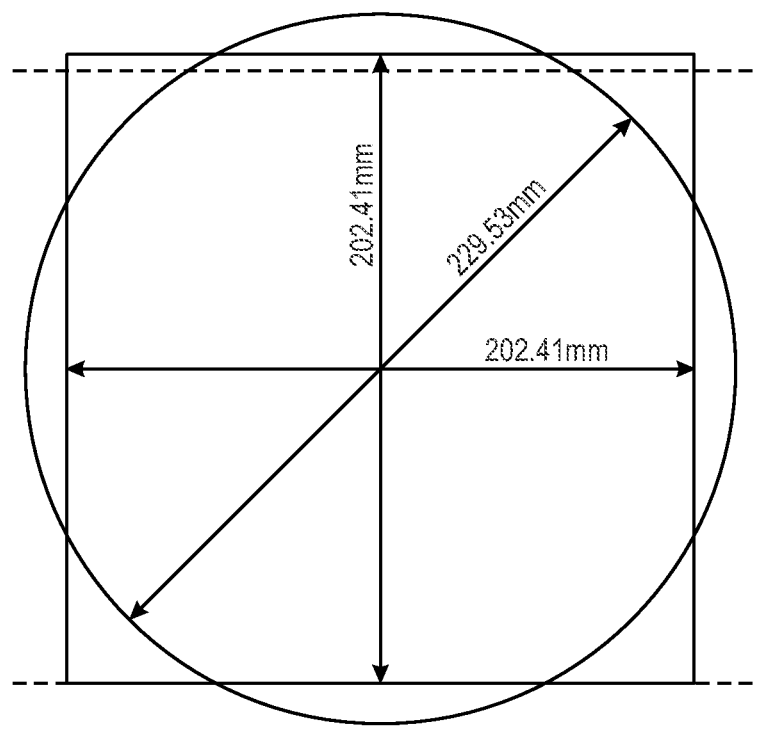
FIG. 7 depicts a geometric basis for the active area shape shown in FIG. 6, in accordance with aspects of the present disclosure.
Figure 8:
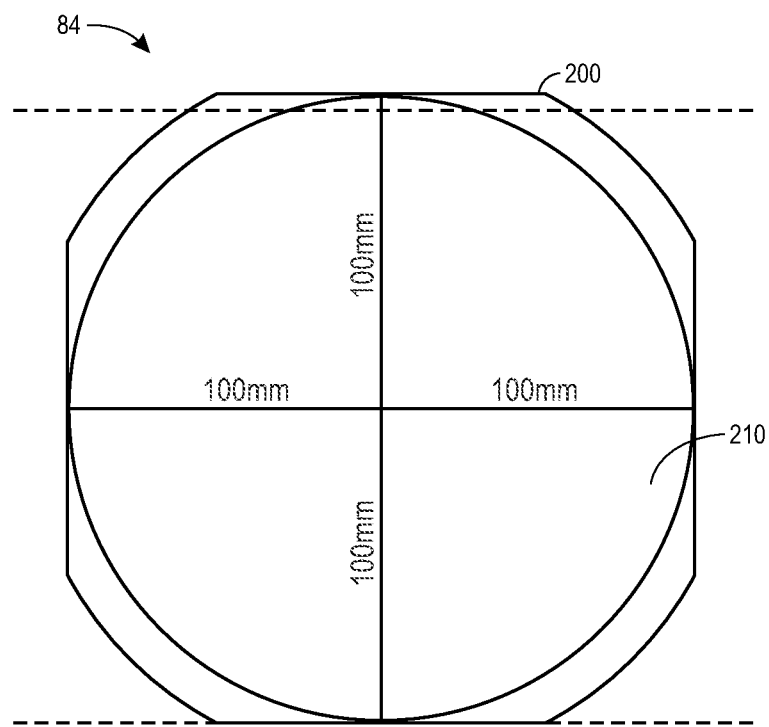
FIG. 8 depicts a circular c-Si wafer quartered into quadrants, in accordance with aspects of the present disclosure.
Figure 9:
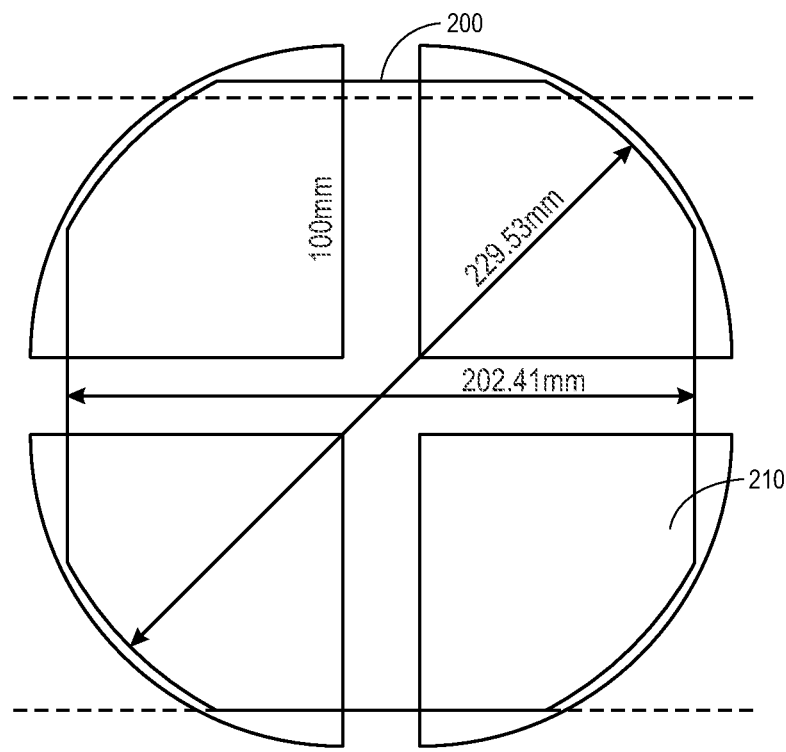
FIG. 9 depicts the quadrants of FIG. 8 spread outward to conform to a portion of the non-rectangular shape of FIG. 6, in accordance with aspects of the present disclosure.

As will be appreciated from the geometric foundation illustrated in FIG. 7, the light imager panel 84 of FIG. 6 can be considered as having aspects of both circular and rectangular (or square) geometric shapes. With this in mind, and turning to FIGS. 8-12, examples are shown of approaches whereby less than two 8" c-Si wafers 130 may be used in the fabrication of a light imager panel 84 as shown in FIG. 6. As will be appreciated, and as noted above, though particular shapes and dimensions are provided in the present examples to facilitate explanation, it should be appreciated that the present concepts and approach are applicable in other contexts and with respect to light imager panels of other shapes and/or dimensions.

Turning back to the present example and to FIG. 8, as can be seen, a single 8" wafer 130 fits within the bounds of the non-rectangular shape 200 corresponding to the active area and shape of a light imager panel 84 of the present example. Thus, such a single wafer 130 has insufficient surface area to form a light imager panel 84 of the desired shape 200 alone. In the depicted example, the first wafer 130 may be cut (using conventional lithographic or dicing techniques) into four wedge-shaped quadrants 210, here shown as having straight edges of approximately 100 mm each. Once cut and split in this manner, it can be seen (FIG. 9) that the quadrants 210 can be split apart so as to provide a substantial portion of the non-rectangular shape 200 of a light imager panel 84 having a suitable active area for various imaging applications.

Figure 10:
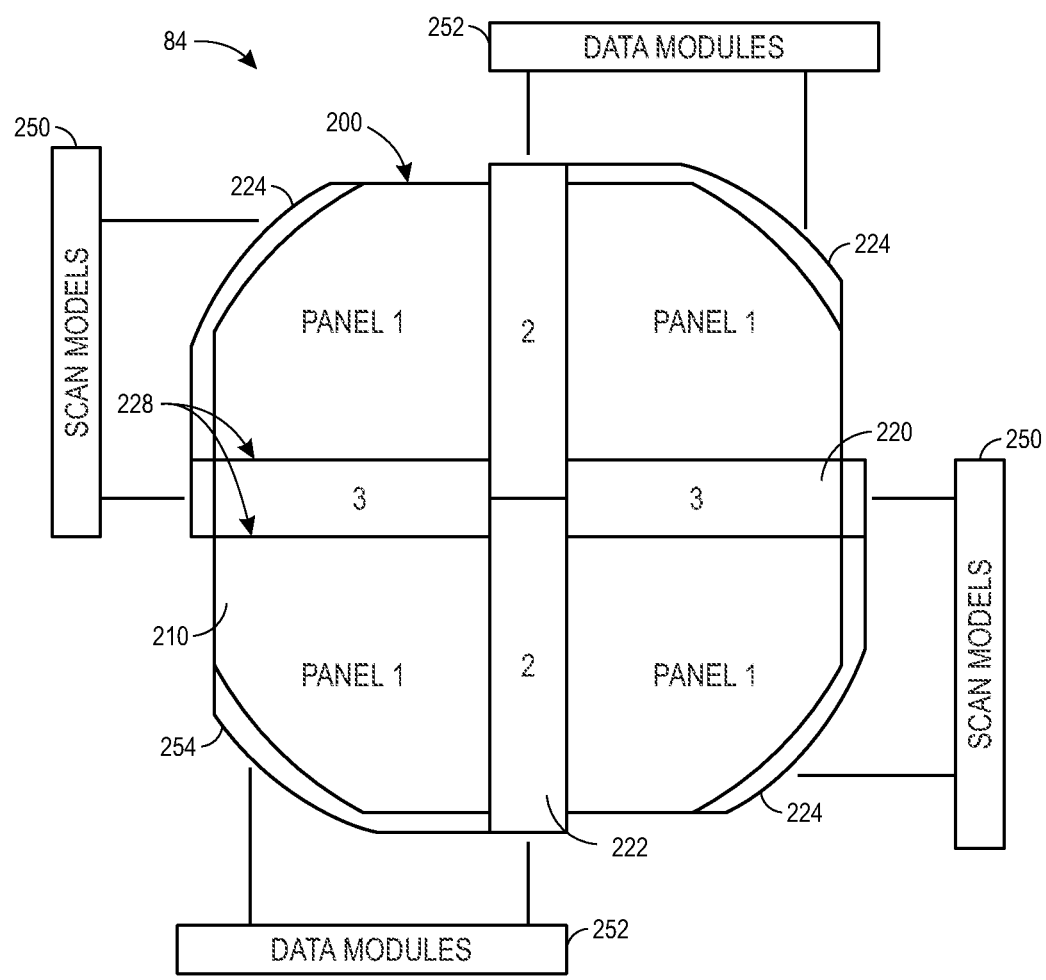
FIG. 10 depicts the use of rectangular sub-panels tiled with the separated quadrants of FIG. 9 to provide an approximation of the active area shape of FIG. 6 in an arrangement with electrical connections between sub-panels, in accordance with aspects of the present disclosure.

Turning to FIG. 10, it can be seen that rectangular sub-panels 220, 222 can be introduced fill the spaces between the quadrants 210 so as to form a tiled light imager panel 84. In depicted example, the sub-panels 220 may be 95 mm×24 mm while the sub-panels 222 may be 108 mm×24 mm, thus providing a light imager panel having a shape and active area corresponding to the non-rectangular shape 200.

As will be appreciated from FIG. 10, in addition to the active area lying within the boundary corresponding to shape 200, a portion 224 of the tiled panels 210, 220, and 222 is outside the boundary 200 corresponding to the active area of the panel 84. This portion 224 may constitute an electronics or contact area 224 whereby contacts with external scan modules 250 and data modules 252 may be formed (such as in an alternating quadrant manner, as shown in FIG. 10) or, alternatively, the respective scan circuitry and data circuitry may be formed directory on the portions 224.

In one implementation, shown in FIG. 10, in addition to connections formed at the contact region (e.g., finger contact region) 224, the sub-panels 210, 220, 222 may be electrically connected (e.g., via wire-bonding 228 to adjacent sub-panels) so as to form electrical connections between sub-panels, allowing a row or column of pixels to be selected or readout across the full extent of the light imager panel 84. Such an implementation is useful in the depicted context as it allow the depicted scan modules and data modules to electronically access full rows or columns of pixels without being limited by the bounds of the respective sub-panels.

Figure 11:
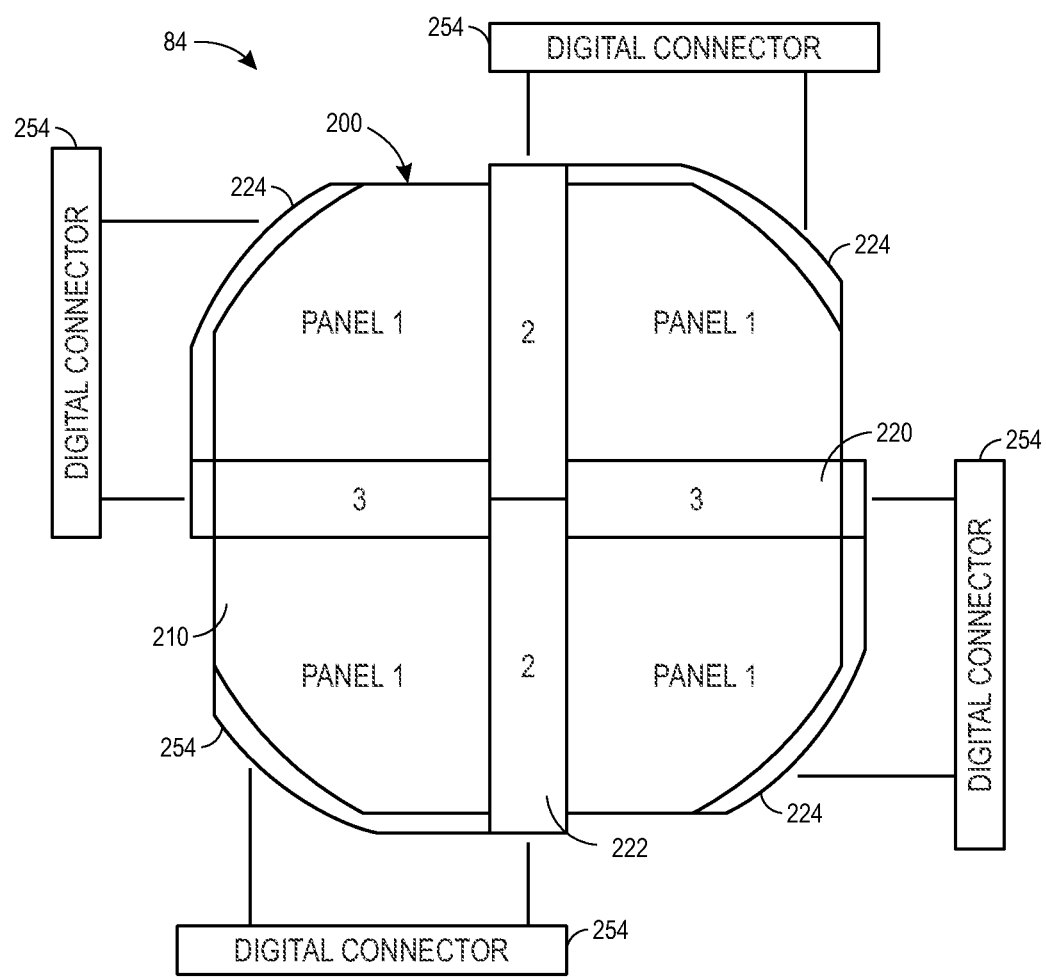
FIG. 11 depicts the use of rectangular sub-panels tiled with the separated quadrants of FIG. 9 to provide an approximation of the active area shape of FIG. 6 in an arrangement without electrical connections between sub-panels, in accordance with aspects of the present disclosure.
Figure 12:
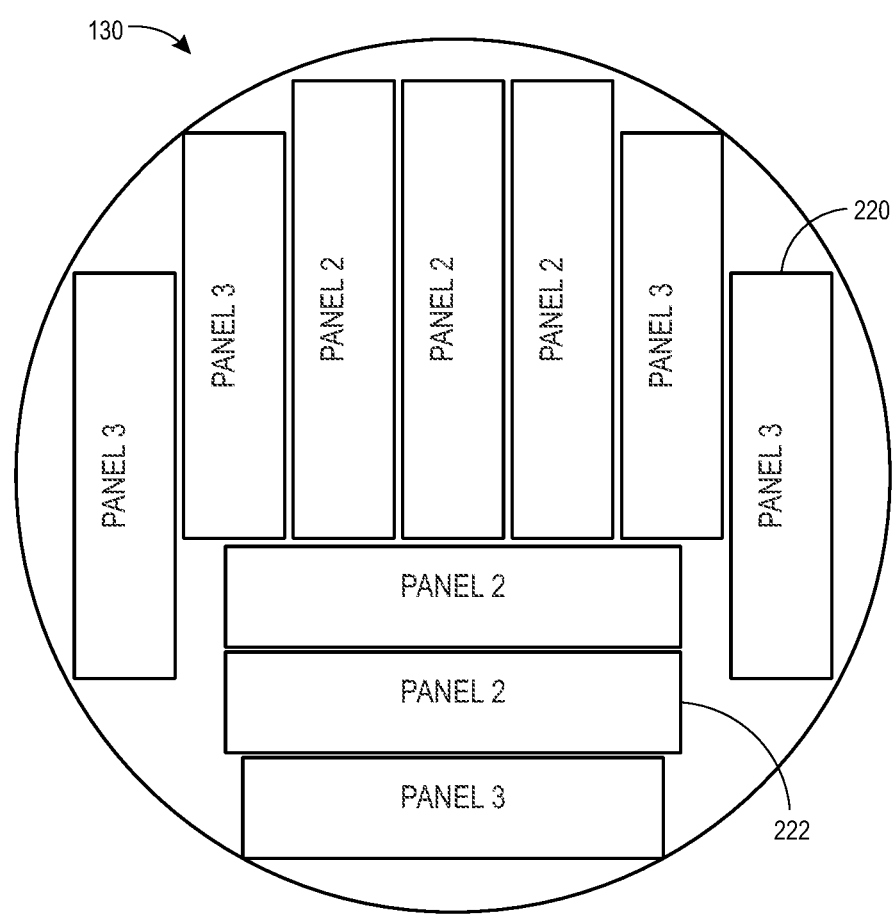
FIG. 12 depicts the use of a single c-Si wafer to form multiple copies of the rectangular sub-panels of FIGS. 10 and 11, in accordance with aspects of the present disclosure.

Turning to FIG. 11, however, an alternative implementation is shown in which the sub-panels 210, 220, 222 are not electrically connected to one another. Instead, each sub-panel 210, 220, 222 is electrically accessed and handled separately and only mechanical tiled (as opposed to electrical connected) relative to one another to form the light imager panel 84. Thus, in such an implementation, each sub-panel only has an electrical interface or connection along one side (e.g., connection region 224) and may be abutted to adjacent sub-panels on the other three sides without needing to form a wire bond or other electrical connection.

In such an embodiment, the respective scan logic may be provided on each of the sub-panels themselves, such as being embedded inside one or more lines of pixels, allowing both the readout and scan interfaces to be provided on only one side of the sub-panel, here at connection or interface region 224. By way of example, FIG. 11 depicts a light imager panel 84 formed using sub-panels 210, 220, 222 with embedded select, reset, and/or readout logic provided on the sub-panels themselves, along with amplification and analog-to-digital conversion, such that digital signals are output at the connection region 224 to digital connectors 254. Such digital connections and readout are less connection and space intensive, and may be useful to avoid complex interface layouts as well as to reduce noise related to transmission of analog signals over an extended distance.

With respect to manufacturing efficiency, multiple of the rectangular sub-panels 220, 222 may be formed on and diced or cut from a single c-Si wafer 130, such as an 8" wafer. For example, turning to FIG. 12, it can be seen that five sub-panels 220 and five sub-panels 222 of the dimensions used in the present example can be formed on, and cut or diced from, a single 8" c-Si wafer. Keeping in mind that a single 8" wafer can be used to form four quadrants 210, which in conjunction with two each of sub-panels 220 and 222 are used to form a non-linear light imager panel 84 as discussed herein, the present approach allows five light imager panels 84 (and thus detectors 22) to be formed using seven wafers 130. This is in contrast to the three wafers 130 needed to produce a single light imager panel (and, hence, fifteen wafers needed to produce five light imager panels) as discussed above with respect to FIG. 5. Thus, the present approach allows for a savings in wafers of approximately 53% relative to prior approaches.

Technical effects of the invention include fabrication of non-rectangular light imager panels having comparable active areas to rectangular light imager panels but manufactured using fewer c-Si wafers. Such light imager panels may be generally squircle shaped (e.g., a square or rectangle with one or more rounded corners.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A flat panel X-ray detector comprising:
   a scintillator layer that converts X-ray photons into lower energy light photons;
   a light imager layer comprising a tiled arrangement of imager panels configured to convert the light photons into electrons, wherein at least one imager panel comprises a non-rectangular active area, and wherein the tiled arrangement of light imager panels comprise four wedge-shaped panels forming the rounded corners of the light imager layer and two or more rectangular panels positioned between the wedge-shaped panels to form straight edges of the light imager layer;
   a readout device that converts the electrons into digitized pixel values, and
   a communication unit that transfers the pixel values to an imaging system that is connected to the detector.

2. The flat panel X-ray detector of claim 1, wherein the light imager layer further comprises an electronic contract region formed along alternating quadrants of the tiled arrangement of imager panels.

3. The flat panel X-ray detector of claim 1, wherein the imager panels comprise crystalline silicon.

4. The flat panel detector of claim 3, wherein the imager panels are formed from circular crystalline silicon wafers.

5. The flat panel X-ray detector of claim 1, wherein the imager panels in the tiled arrangement are electrically connected to one another.

6. The flat panel X-ray detector of claim 1, wherein the imager panels in the tiled arrangement are not electrically connected to one another.

7. A method for forming a light imager panel comprising:
   dicing a silicon wafer into wedge-shaped quadrant imager tiles;
   separating the wedge-shaped quadrant tiles along at least one dimension;
   between the separated wedge-shaped quadrant tiles, positioning at least a pair of rectangular imager tiles to form a non-rectangular light imager panel configured to convert light photons into electrons.

8. The method of claim 7, wherein the non-rectangular light imager panel has a squircle shape.

9. The method of claim 7, comprising alternately forming scan circuitry and data circuitry on quadrants of the light imager panel.

10. The method of claim 7, comprising alternately connecting scan modules and data modules to quadrants of the light imager panel.

11. The method of claim 7, comprising electrically connecting the at least a portion of the wedge-shaped quadrant tiles and rectangular imager tiles.

12. The method of claim 7, wherein:
    separating the separating the wedge-shaped quadrant tiles along at least one dimension comprises separating the wedge-shaped quadrant tiles along orthogonal two-dimensions; and
    wherein positioning at least a pair of rectangular imager tiles between the separated wedge-shaped quadrant tiles comprises positioning a respective pair of rectangular imager tiles between the separated wedge-shaped quadrant tiles in each of the two dimensions.

13. A light imager panel for use in a radiation detector, the light imager panel comprising:
    four wedge-shaped panels forming the rounded corners of the light imager panel;
    two or more rectangular panels positioned between the wedge-shaped panels to form straight edges of the light imager panel, wherein the light imager panel is configured to convert light photons into electrons.

14. The light imager panel of claim 13, wherein one or both of the wedge-shaped panels and the rectangular panels comprise an electronics connection region on the periphery of the light imager panel.

15. The light imager panel of claim 13, wherein one or both of scan circuitry or data circuitry is formed on the electronics connection regions.

16. The light imager panel of claim 13, wherein one or both of scan modules or data modules not formed on the light imager panel are connected to the electronics connection regions.

17. The light imager panel of claim 13, wherein the two or more rectangular panels comprise four rectangular panels such that a first pair of rectangular panels is positioned between the wedge-shaped panels in a first direction and a second pair of rectangular panels is positioned between the wedge-shaped panels in a second direction.

18. The light imager panel of claim 13, comprising electrical connections formed between at least a portion of the wedge-shaped panels and rectangular panels.

* * * * *